United States Patent
Okada et al.

(10) Patent No.: US 9,558,877 B2
(45) Date of Patent: Jan. 31, 2017

(54) FERRITE CERAMIC COMPOSITION, CERAMIC ELECTRONIC COMPONENT, AND METHOD FOR PRODUCING CERAMIC ELECTRONIC COMPONENT

(71) Applicant: MURATA MANUFACTURING CO., LTD., Kyoto (JP)

(72) Inventors: Yoshiko Okada, Kyoto (JP); Atsushi Yamamoto, Kyoto (JP); Akihiro Nakamura, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 43 days.

(21) Appl. No.: 14/192,686

(22) Filed: Feb. 27, 2014

(65) Prior Publication Data

US 2014/0176286 A1   Jun. 26, 2014

Related U.S. Application Data

(63) Continuation of application No. PCT/JP2012/071858, filed on Aug. 29, 2012.

(30) Foreign Application Priority Data

Sep. 2, 2011 (JP) ................. 2011-192023

(51) Int. Cl.
H01F 5/00 (2006.01)
H01F 27/28 (2006.01)
(Continued)

(52) U.S. Cl.
CPC ........... *H01F 17/0013* (2013.01); *B32B 18/00* (2013.01); *C04B 35/265* (2013.01); *C04B 35/638* (2013.01);
(Continued)

(58) Field of Classification Search
None
See application file for complete search history.

(56) References Cited

U.S. PATENT DOCUMENTS 6,146,545 A   11/2000  Murase
2006/0180342 A1*  8/2006  Takaya ................ H01L 23/642
                                                              174/256
(Continued)

FOREIGN PATENT DOCUMENTS

CN   1222486 C   10/2005
JP   35-009226 B   7/1960
(Continued)

OTHER PUBLICATIONS

English translation of JP2010018482.*
(Continued)

*Primary Examiner* — Mangtin Lian
*Assistant Examiner* — Ronald Hinson
(74) *Attorney, Agent, or Firm* — Studebaker & Brackett PC

(57) ABSTRACT

A coil conductor and a via electrode placed away from the coil conductor are embedded in a magnetic layer. The magnetic layer is sandwiched between a pair of non-magnetic layers. The coil conductor and the via electrode are formed from a conductive material containing Cu as its main constituent, and the magnetic layer is formed from Ni—Mn—Zn ferrite where the CuO molar content is 5 mol % or less, and (x, y) falls within the range of A (25, 1), B (47, 1), C (47, 7.5), D (45, 7.5), E (45, 10), F (35, 10), G (35, 7.5), and H (25, 7.5) when the molar content x of $Fe_2O_3$ and the molar content y of $Mn_2O_3$ are represented by (x, y). Thus, insulation properties can be ensured, favorable electrical characteristics can be achieved, and a ceramic electronic component is achieved which is able to be reduced in size.

9 Claims, 6 Drawing Sheets

(51) Int. Cl.
*H01F 17/00* (2006.01)
*H01B 3/12* (2006.01)
*B32B 18/00* (2006.01)
*C04B 35/26* (2006.01)
*C04B 35/634* (2006.01)
*C04B 35/638* (2006.01)
*H01F 41/04* (2006.01)
*H05K 3/00* (2006.01)
*H01F 1/34* (2006.01)
*H01F 27/29* (2006.01)

(52) U.S. Cl.
CPC .............. *C04B 35/6342* (2013.01); *H01B 3/12* (2013.01); *H01F 1/344* (2013.01); *H01F 17/0033* (2013.01); *H01F 27/2804* (2013.01); *H01F 41/041* (2013.01); *H01F 41/046* (2013.01); *H05K 3/0058* (2013.01); *C04B 2235/3265* (2013.01); *C04B 2235/3279* (2013.01); *C04B 2235/3281* (2013.01); *C04B 2235/3284* (2013.01); *C04B 2235/6025* (2013.01); *C04B 2235/6567* (2013.01); *C04B 2235/6584* (2013.01); *C04B 2235/96* (2013.01); *C04B 2237/06* (2013.01); *C04B 2237/68* (2013.01); *H01F 27/292* (2013.01); *Y10T 29/49155* (2015.01)

(56) References Cited

U.S. PATENT DOCUMENTS

| | | | | |
|---|---|---|---|---|
| 2007/0164414 | A1* | 7/2007 | Dokai | G06K 19/07749 257/679 |
| 2009/0056987 | A1* | 3/2009 | Nomiya | H01L 21/4857 174/255 |
| 2009/0068426 | A1 | 3/2009 | Nishizawa | |
| 2012/0013429 | A1* | 1/2012 | Kim | H01F 1/344 336/200 |
| 2012/0056705 | A1* | 3/2012 | Kim | H01F 17/0033 336/200 |
| 2012/0297610 | A1 | 11/2012 | Yamamoto et al. | |
| 2014/0176285 | A1* | 6/2014 | Nakamura | H01F 17/0013 336/200 |

FOREIGN PATENT DOCUMENTS

| | | |
|---|---|---|
| JP | 04-061203 A | 2/1992 |
| JP | 2000-169217 A | 6/2000 |
| JP | 2001-284819 A | 10/2001 |
| JP | 2006-156451 A | 6/2006 |
| JP | 2006-210616 A | 8/2006 |
| JP | 2007-266245 A | 10/2007 |
| JP | 2010-018482 A | 1/2010 |
| JP | 2010-235324 A | 10/2010 |
| JP | 4703459 B2 | 6/2011 |
| WO | 2007/145189 A1 | 12/2007 |
| WO | 2011/093489 A1 | 8/2011 |

OTHER PUBLICATIONS

English translation of JP2010018482 Jan. 28, 2010.*
International Search Report; PCT/JP2012/071858; Dec. 11, 2012.
Written Opinion of the International Searching Authority; PCT/JP2012/071858; Dec. 11, 2012.
An Office Action; "Notice of Reasons for Rejection," issued by the Japanese Patent Office on Apr. 13, 2015, which corresponds to Japanese Patent Application No. 2013-531363 and is related to U.S. Appl. No. 14/192,686; with English language translation.

* cited by examiner

FERRITE CERAMIC COMPOSITION, CERAMIC ELECTRONIC COMPONENT, AND METHOD FOR PRODUCING CERAMIC ELECTRONIC COMPONENT

CROSS REFERENCE TO RELATED APPLICATIONS

This application claims benefit of priority to Japanese Patent Application No. 2011-192023 filed Sep. 2, 2011, and to International Patent Application No. PCT/JP2012/071858 filed on Aug. 29, 2012, the entire content of each of which is incorporated herein by reference.

TECHNICAL FIELD

The present invention relates to a ferrite ceramic composition, a ceramic electronic component, and a method for producing a ceramic electronic component, and more particularly, relates to a ferrite ceramic composition which is able to be subjected to co-firing with a conductive material containing Cu as its main constituent, a ceramic electronic component such as a ceramic multi-layer substrate with the use of the ferrite ceramic composition, and a method for producing the component.

BACKGROUND

In recent years, ceramic electronic components have been extensively used, and ceramic multi-layer substrates with built-in coil conductors have been widely used.

For example, Japanese Patent No. 4703459 proposes a built-in coil substrate including: a pair of insulating bases; a ferrite magnetic layer provided between the pair of insulating bases; a planar spiral coil formed in the ferrite magnetic layer; a highly magnetic body provided in the central area of the planar spiral coil, which has a higher magnetic permeability than the ferrite magnetic layer; and a non-magnetic body provided between the planar spiral coil and the highly magnetic body, which has a lower magnetic permeability than the ferrite magnetic layer.

Japanese Patent No. 4703459 states that Cu, Ag, Au, Pt, Ag—Pd alloys, Ag—Pt alloys, etc. can be used as the metal materials for use in the coil conductors.

In addition, International Publication No. 2007/145189 proposes a laminate-type ceramic electronic component provided with a ceramic laminate body which has a laminate structure including a ceramic base material layer composed almost entirely of a polycrystalline phase, and a ceramic auxiliary layer placed on at least one principal surface of the ceramic base material layer and composed almost entirely of a polycrystalline phase, which is obtained by co-firing with the ceramic base material layer; and a conductor pattern provided inside and/or outside the ceramic laminate body.

In International Publication No. 2007/145189, Ag is used as the conductor pattern.

SUMMARY

Problem to be Solved by the Invention

However, Au, Pt, Ag—Pd alloys, and Ag—Pt alloys are expensive in terms of material cost, and inferior in productivity, although Japanese Patent No. 4703459 states that Cu, Ag, Au, Pt, Ag—Pd alloys, Ag—Pt alloys, etc. can be used as the metal materials for the coil conductors.

In addition, Ag is relatively inexpensive, but likely to cause migration to lead to deterioration of moisture resistance, for this reason, it is difficult to reduce the via-coil gap with different potentials applied thereto, and there is a limit on the reduction in size of the ceramic multi-layer substrate. In particular, in the case of ceramic multi-layer substrates for use in DC/DC converters, the suppression of migration is an important issue because a DC bias voltage is applied between electrodes inside.

Moreover, while Ni—Zn ferrite is commonly subjected to firing in atmosphere, firing in atmosphere has the possibility of oxidizing Cu when Cu is used for coil conductors or via electrodes.

On the other hand, when firing is carried out in a reducing atmosphere in order to avoid the oxidation of Cu, there is a possibility that $Fe_2O_3$ in the ferrite material will be reduced to $Fe_3O_4$, thereby leading to a decrease in resistivity ρ.

More specifically, at temperatures of 800° C. or higher, when firing is carried out with the oxygen partial pressure set in such an oxidizing atmosphere that maintains the state of $Fe_2O_3$, Cu is also oxidized to produce $Cu_2O$. On the other hand, when firing is carried out with the oxygen partial pressure set in a reducing atmosphere that maintains the state of Cu metal, $Fe_2O_3$ is reduced to produce $Fe_3O_4$.

As just described, it is known that from the relationship between the equilibrium oxygen partial pressure of Cu—$Cu_2O$ and the equilibrium oxygen partial pressure of $Fe_2O_3$—$Fe_2O_4$, there is no region where Cu and $Fe_2O_3$ coexist at high temperatures of 800° C. or higher.

Therefore, in Japanese Patent No. 4703459, even when Cu and a ferrite material are subjected to co-firing under a reducing atmosphere, firing in such a reducing atmosphere in which Cu is not oxidized reduces $Fe_2O_3$ to $Fe_3O_4$ to decrease resistivity ρ because there is no region where the Cu and $Fe_2O_3$ coexist, thereby possibly degrading electrical characteristics such as impedance characteristics.

The present invention has been achieved in view of these circumstances, and an object of the present invention is to provide a ferrite ceramic composition which can ensure insulation properties and achieve favorable electrical characteristics even in the case of co-firing with a conductive material containing Cu as its main constituent, a ceramic electronic component with the use of the ferrite ceramic composition, such as a ceramic multi-layer substrate, which has high reliability and allows for reduction in size, and a method for producing the ceramic electronic component.

Means for Solving the Problem

The inventors have found, through earnest studies on ferrite materials which have spinel-type crystal structures represented by the general formula $X_2O_2 \cdot MeO$ (X:Fe, Mn; Me:Zn, Cu, Ni), that when the molar contents of Fe and Mn are adjusted to fall within specific ranges respectively in terms of $Fe_2O_3$ and $Mn_2O_3$ while the molar content of Cu is adjusted to 5 mol % or less in terms of CuO, desired favorable insulation properties can be achieved even when a Cu material and the ferrite materials are subjected to co-firing, and it is thus possible to achieve ceramic electronic components which have favorable electrical characteristics.

The present invention has been achieved on the basis of this finding, and a ferrite ceramic composition according to the present invention contains at least Fe, Mn, Ni, and Zn, which is characterized in that the Cu molar content is 0 to 5 mol % in terms of CuO, and when the Fe molar content x mol % in terms of $Fe_2O_3$ and the Mn molar content y mol % in terms of $Mn_2O_3$ are represented by (x, y), the (x, y) falls within the region surrounded by A (25, 1), B (47, 1), C (47, 7.5), D (45, 7.5), E (45, 10), F (35, 10), G (35, 7.5), and H (25, 7.5).

In addition, as a result of further earnest studies by the inventors, it has been determined that while the ferrite ceramic composition preferably contains therein a Zn oxide from the perspective of achieving further favorable characteristics, the Zn content in excess of 33 mol % in terms of ZnO has the possibility of decreasing the Curie point Tc, and failing to guarantee the operation at high temperatures, thereby leading to decreased reliability.

More specifically, in the ferrite ceramic composition according to the present invention, the molar content of the Zn is preferably 33 mol % or less in terms of ZnO.

This molar content can ensure an adequate Curie point, and achieve a ceramic electronic component which guarantees the operation under the condition of high temperatures for use.

Furthermore, from the result of the studies by the inventors, it has been determined that the Zn content is desirably 6 mol % or more in terms of ZnO, in consideration of the magnetic permeability $\mu$ of the ferrite.

More specifically, in the ferrite ceramic composition according to the present invention, the molar content of Zn is preferably 6 mol % or more in terms of ZnO.

This molar content makes it possible to ensure favorable magnetic permeability.

In addition, a ceramic electronic component according to the present invention, including a coil conductor and a via electrode placed away from the coil conductor, which are embedded in a magnetic layer, is characterized in that the coil conductor and the via electrode are formed from a conductive material containing Cu as its main constituent, and the magnetic layer is formed from the ferrite ceramic composition described above.

Thus, even when the magnetic layer, the coil conductor, and the via electrode are formed by co-firing, it becomes possible to achieve desired favorable electrical characteristics and magnetic characteristics without causing migration, unlike Ag materials. Therefore, the gap can be reduced between the coil conductor and via electrode with different potentials applied thereto, and it becomes possible to reduce the size of the ceramic electronic component.

In addition, the occurrence of migration can be suppressed as much as possible as described above, and it thus becomes possible to use the component for a DC/DC converter with a DC bias voltage applied between electrodes inside in a preferred manner.

In addition, in the ceramic electronic component according to the present invention, preferably, the magnetic layer is sandwiched between a pair of non-magnetic layers, and external electrodes formed on principal surfaces of the non-magnetic layers are electrically connected therebetween through the via electrode.

This can reduce the gap between the coil conductor and via electrode embedded in the magnetic layer, thus making it possible to reduce the size of the ceramic electronic component.

Furthermore, in the ceramic electronic component according to the present invention, preferably, the non-magnetic layers contain at least Fe, Mn, and Zn, contain no Ni, and have a Cu molar content of 0 to 5 mol % in terms of CuO, and when the Fe molar content x mol % in terms of $Fe_2O_3$ and the Mn molar content y mol % in terms of $Mn_2O_3$ are represented by (x, y), the (x, y) falls within the region surrounded by A (25, 1), B (47, 1), C (47, 7.5), D (45, 7.5), E (45, 10), F (35, 10), G (35, 7.5), and H (25,7.5).

This can form the magnetic layer and non-magnetic layers in the same composition system, and thus reduce the difference in shrinkage behavior during the firing, thereby making it possible to achieve a ceramic electronic component with a desired mechanical strength.

In addition, in the ceramic electronic component according to the present invention, preferably, a non-magnetic layer is formed on at least one principal surface of the magnetic layer. Further, a cavity section filled with an inert gas is formed in either one of the non-magnetic layer and the magnetic layer. Further, at least a pair of discharge electrodes is placed to be opposed with a predetermined gap therebetween in the cavity section, and the discharge electrodes are formed from a conductive material containing Cu as its main constituent.

Thus, the ceramic electronic component is allowed to function as an ESD (Electro-Static Discharge) protection element. Moreover, the cavity section filled with an inert gas can thus lower the discharge starting voltage, and achieve a ceramic electronic component which has a more favorable ESD protection function.

Furthermore, preferably, the ceramic electronic component according to the present invention has the pair of discharge electrodes connected to each other through an auxiliary electrode, and the auxiliary electrode has a conductive material containing Cu as its main constituent, which is dispersed in either one of the non-magnetic material forming the non-magnetic layer and the magnetic material forming the magnetic layer.

Thus, the difference in shrinkage behavior can be reduced, which can be produced between the discharge electrodes and the non-magnetic layer.

In addition, the ceramic electronic component according to the present invention preferably has the coil conductor, the via electrode, the magnetic layer, and the non-magnetic layer obtained by co-firing.

In addition, the ceramic electronic component according to the present invention is preferably obtained by firing in an atmosphere of lower than or equal to the equilibrium oxygen partial pressure of Cu—$Cu_2O$.

Thus, even when the coil conductor, the via electrode, the magnetic layer, and the non-magnetic layer are formed by co-firing, the gap between the coil conductor and the via electrode can be reduced while ensuring desired electrical characteristics and magnetic characteristics without oxidizing Cu or reducing $Fe_2O_3$, and moreover, it becomes possible to achieve a ceramic electronic component such as a ceramic multi-layer substrate which has a further favorable ESD protection function.

Further, a method for manufacturing a ceramic electronic component according to the present invention is characterized in that it includes: a first calcination step of weighing a Fe compound, a Mn compound, a Cu compound, a Zn compound, and a Ni compound so that the Cu molar content is 0 to 5 mol % in terms of CuO, and when the Fe molar content x mol % in terms of $Fe_2O_3$ and the Mn molar content y mol % in terms of $Mn_2O_2$ are represented by (x, y), the (x, y) meets the region surrounded by A (25, 1), B (47, 1), C (47, 7.5), D (45, 7.5), E (45, 10), F (35, 10), G (35, 7.5), and H (25,7.5), and mixing and then calcining the weighed compounds to prepare a first calcined powder; a ceramic green sheet preparation step of preparing a first ceramic green sheet to serve as a magnetic layer from the first calcined powder; a through hole formation step of forming through holes in predetermined positions of the first ceramic green sheet; a conductive-film and via-conductor formation step of applying a conductive paste containing Cu as its main constituent to the first ceramic green sheet to form conductive films in a predetermined pattern, and filling the through holes with the conductive paste to form a first via conductor for providing electrical conduction between the conductive films and a second via conductor to serve as a via electrode electrically insulated from the conductive films; a laminated body formation step of stacking the first ceramic green sheet with the conductive films and first and second via conductors formed in a predetermined order to form a laminated body; and a firing step of firing the laminated body in a firing atmosphere at lower than or equal to the equilibrium oxygen partial pressure of Cu—$Cu_2O$.

Thus, even when the ceramic green sheets, and the coil conductors and via conductors containing Cu as their main constituent are subjected to co-firing in a firing atmosphere of lower than or equal to the equilibrium oxygen partial pressure of Cu—$Cu_2O$, a ceramic electronic component with favorable insulation properties and high reliability can be achieved without oxidizing Cu or reducing Fe. Moreover, because Cu is used for the conductive material without the use of Ag therefor, it becomes possible to avoid the occurrence of migration, the gap can be reduced between the via electrode and the coil conductor, and the ceramic electronic component can be reduced in size.

In addition, the method for manufacturing a ceramic electronic component according to the present invention preferably includes: a second calcination step of weighing a Fe compound, a Mn compound, a Cu compound, and a Zn compound so that the Cu molar content is 0 to 5 mol % in terms of CuO, and when the Fe molar content x mol % in terms of $Fe_2O_3$ and the Mn molar content y mol % in terms of $Mn_2O_3$ are represented by (x, y), the (x, y) meets the region surrounded by the points A through H mentioned above, and mixing and then calcining the weighed compounds to prepare a second calcined powder; a second ceramic green sheet preparation step of preparing a second ceramic green sheet to serve as a non-magnetic layer from the second calcined powder; and a third via conductor formation step of forming a third via conductor in a predetermined position of the second ceramic green sheet, so as to allow electrical conduction to and from the second via conductor, and the first ceramic green sheet and the second ceramic green sheet are stacked in a predetermined order to form a laminated body in the laminated body formation step.

This method can reduce the difference in shrinkage behavior during the co-firing, due to the non-magnetic layer formed from the same composition system as for the magnetic layer.

Furthermore, preferably, the method for manufacturing a ceramic electronic component according to the present invention includes: a mixed paste preparation step of mixing the magnetic material or the non-magnetic material with a conductive material containing Cu as its main constituent to prepare a mixed paste with the conductive material dispersed in the magnetic material or the non-magnetic material; a resin paste preparation step of preparing a resin paste containing a thermally-degradable resin material which disappears by firing; a mixed section formation step of applying the mixed paste onto the first or second ceramic green sheet to form a mixed section in a predetermined pattern to serve as an auxiliary electrode; an electrode film formation step of forming an electrode film in a predetermined pattern to serve as a discharge electrode on the first or second ceramic green sheet with the mixed section formed thereon; and a resin coating section preparation step of applying the resin paste onto the first or second ceramic green sheet with the electrode film formed thereon to prepare a resin coating section to serve as a cavity section, and another first or second ceramic green sheet is stacked on the first or second ceramic green sheet with the resin coating section formed thereon in the laminated body formation step, and the resin coating section is allowed to disappear to form the cavity section in the firing step.

Thus, through the firing in a reducing atmosphere of lower than or equal to the equilibrium oxygen partial pressure of Cu—$Cu_2O$, the cavity section formed by the disappearance of the resin coating section is filled with an inert gas, a lower discharge starting voltage can be obtained, and it becomes possible to achieve a ceramic electronic component which is excellent in ESD protection function.

Advantageous Effect of the Invention

In the ferrite ceramic composition, the Cu molar content is 0 to 5 mol % in terms of CuO, and when the Fe molar content x mol % in terms of $Fe_2O_3$ and the Mn molar content y mol % in terms of $Mn_2O_3$ are represented by (x, y), the (x, y) falls within the specific region surrounded by the points A through H mentioned above. Thus, even when the ferrite ceramic composition is subjected to co-firing with a Cu material, Cu and $Fe_2O_3$ can be kept from being oxidized and reduced respectively, and desired insulation properties can be thereby ensured without causing a decrease in resistivity ρ.

Specifically, favorable insulation properties can be achieved with the resistivity ρ of $10^7$ Ω·cm or more. Thus, it becomes possible to achieve a desired ceramic electronic component which has favorable electrical characteristics such as impedance characteristics.

In addition, in the ceramic electronic component according to the present invention, including a coil conductor and a via electrode placed away from the coil conductor, which are embedded in a magnetic layer, the coil conductor and the via electrode are formed from a conductive material containing Cu as their main constituent, and the magnetic layer is formed from the ferrite ceramic composition described above. Thus, even when the magnetic layer, the coil conductor, and the via electrode are formed by co-firing, it becomes possible to achieve desired favorable electrical characteristics and magnetic characteristics without causing migration. Therefore, the gap can be reduced between the coil conductor and via electrode with different potential applied thereto, and it becomes possible to reduce the size of the ceramic electronic component.

In addition, the method for manufacturing a ceramic electronic component according to the present invention includes: the first calcination step of weighing a Fe compound, a Mn compound, a Cu compound, a Zn compound, and a Ni compound so that the Cu molar content is 0 to 5 mol % in terms of CuO, and when the Fe molar content x mol % in terms of $Fe_2O_3$ and the Mn molar content y mol % in terms of $Mn_2O_3$ are represented by (x, y), the (x, y) meets the specific region mentioned above, and mixing and then calcining the weighed compounds to prepare a first calcined powder; the ceramic green sheet preparation step of preparing a first ceramic green sheet to serve as a magnetic layer from the first calcined powder; the second ceramic green sheet preparation step of preparing a second ceramic green sheet composed of a non-magnetic material to serve as a non-magnetic layer; the through hole formation steps of forming through holes in predetermined positions of the first and second ceramic green sheets; the conductive-film and via-conductor formation steps of applying a conductive paste containing Cu as its main constituent to the first and second ceramic green sheets to form conductive films in a predetermined pattern, and filling the through holes with the conductive paste to form via conductors; the laminated body formation step of stacking the first and second ceramic green sheets with the conductive films and via conductors formed in a predetermined order to form a laminated body with the magnetic layer sandwiched between a pair of the non-magnetic layers; and the firing step of firing the laminated body in a firing atmosphere of lower than or equal to the equilibrium oxygen partial pressure of Cu—$Cu_2O$. Thus, even when the ceramic green sheets and the coil conductors and via conductors containing Cu as their main constituent are subjected to co-firing in a firing atmosphere of lower than or equal to the equilibrium oxygen partial pressure of Cu—$Cu_2O$, a highly reliable ceramic electronic component with favorable insulation properties can be achieved without reducing Fe. Moreover, because Cu is used for the conductive material without the use of Ag therefor, it becomes possible to avoid the occurrence of migration, the gap can be reduced between the via electrode and the coil conductor, and the ceramic electronic component can be reduced in size.

DETAILED DESCRIPTION

Next, embodiments of the present invention will be described in detail.

A ferrite ceramic composition as one embodiment of the present invention has a spinel-type crystal structure represented by the general formula $X_2O_3 \cdot MeO$, contains at least $Fe_2O_3$ and $Mn_2O_3$ as trivalent element compounds and ZnO and NiO as divalent element compounds, and if necessary, contains CuO as a divalent element compound.

Figure 1:
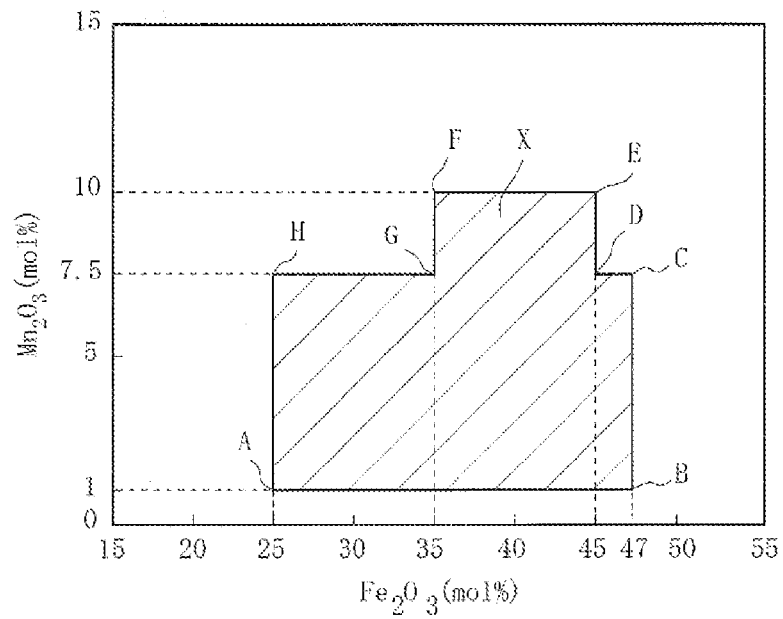
FIG. 1 is a diagram showing the compositional range of $Fe_2O_3$ and $Mn_2O_2$ in a ferrite ceramic composition according to the present invention.

Specifically, in the ferrite ceramic composition, the molar content of Cu is adjusted to 0 to 5 mol % in terms of CuO, the respective molar contents of Fe and Mn are adjusted to have (x, y) in the region of a shaded area X surrounded by points A through H in terms of $Fe_2O_3$ and $Mn_2O_3$ when the molar content of $Fe_2O_3$ and the molar content of $Mn_2O_3$ are respectively represented by x mol % and y mol % as shown in FIG. 1, and the balance is formed from a Zn oxide and a Ni oxide.

In this case, the respective points (x, y) at the points A through H represent the following molar contents.

A (25, 1), B (47, 1), C (47, 7.5), D (45, 7.5), E (45, 10), F (35, 10), G (35, 7.5), and H (25, 7.5).

Next, the reason for the molar contents of Cu, Fe, and Mn in the ranges mentioned above in terms of CuO, $Fe_2O_3$, and $Mn_2O_2$ will be described in detail.

(1) Molar Content of Cu

In the case of Ni—Zn based ferrite, the ferrite ceramic composition containing therein CuO with a low melting point of 1026° C. allows firing at lower temperatures, and the sinterability can be improved.

On the other hand, in the case of co-firing a Cu material containing Cu as its main constituent and a ferrite material, there is a need for firing in such a reducing atmosphere in which Cu is not oxidized, because firing in the atmosphere easily oxidizes Cu to produce $Cu_2O$.

However, in the case of firing in such a reducing atmosphere, the molar content of Cu in excess of 5 mol % in terms of CuO has the possibility of reducing CuO in the ferrite raw material to increase the production of $Cu_2O$, thereby leading to a decrease in resistivity ρ.

Therefore, in the present embodiment, the combination amount is adjusted so that the molar content of Cu is 5 mol % or less, that is, 0 to 5 mol % in terms of CuO.

(2) Respective Molar Contents of Fe and Mn $Fe_2O_3$ reduced in weight from the stoichiometric composition and $Mn_2O_2$ contained in such a way that Fe is partially substituted with Mn can avoid the reduction in resistivity ρ, and make an improvement in insulation properties.

More specifically, in the case of a spinel-type crystal structure (general formula: $X_2O_2 \cdot MeO$), the ratio between $X_2O_3$ (X:Fe, Mn) and MeO (Me:Ni, Zn, Cu) is 50:50 in the stoichiometric composition, and the $X_2O_3$ and the MeO are typically combined so as to generally have the stoichiometric composition.

Further, in the case of co-firing a Cu material containing Cu as its main constituent and a ferrite material, there is a need for firing in such a reducing atmosphere in which Cu is not oxidized, because firing in the atmosphere easily oxidizes Cu to produce $Cu_2O$. On the other hand, there is a need for $Fe_2O_3$ to be subjected to firing in an oxidizing atmosphere, because $Fe_3O_4$ is produced when $Fe_2O_3$ as a main constituent of the ferrite material is subjected to firing in a reducing atmosphere.

However, as also mentioned in the section (Problem to be solved by the invention), it is known that from the relationship between the equilibrium oxygen partial pressure of Cu—$Cu_2O$ and the equilibrium oxygen partial pressure of $Fe_3O_4$—$Fe_2O_3$, there is no region where the Cu metal and $Fe_2O_3$ coexist in the case of firing at high temperatures of 800° C. or higher.

Thus, $Mn_2O_3$ reaches a reducing atmosphere at a higher oxygen partial pressure as compared with $Fe_2O_3$ in a temperature range of 800° C. or higher. Therefore, at an oxygen partial pressure lower than or equal to the equilibrium oxygen partial pressure of Cu—$Cu_2O$, $Mn_2O_3$ reaches a strongly reducing atmosphere as compared with $Fe_2O_3$, and for this reason, $Mn_2O_3$ is preferentially reduced to allow sintering to be completed. More specifically, $Mn_2O_3$ is preferentially reduced as compared with $Fe_2O_3$, thus allowing the firing treatment to be completed before $Fe_2O_3$ is reduced to $Fe_3O_4$.

As described above, while $Fe_2O_3$ is reduced in molar content from the stoichiometric composition, $Mn_2O_3$ which is likewise a trivalent element compound contained in the ferrite ceramic composition, and $Mn_2O_3$ is thereby preferentially reduced even when the Cu material and the ferrite material are subjected to co-firing at lower than or equal to the equilibrium oxygen partial pressure of Cu—$Cu_2O$, thus allowing sintering to be completed before $Fe_2O_3$ is reduced, and allowing for more effective coexistence of the Cu metal and $Fe_2O_3$. Thus, this coexistence can avoid the decrease in resistivity ρ, and improve the insulation properties.

However, when the molar content of Fe is less than 25 mol % in terms of $Fe_2O_3$, the molar content of Fe is excessively decreased to cause a decrease in resistivity ρ in turn, thereby making it impossible to ensure desired insulation properties.

In addition, when the molar content of Mn is less than 1 mol % in terms of $Mn_2O_3$, the molar content of Mn is excessively decreased, and $Fe_2O_3$ is thus likely to be reduced to $Fe_3O_4$ to decrease the resistivity ρ, thereby making it impossible to ensure sufficient insulation properties.

In addition, also when the molar content of Fe is greater than 47 mol % in terms of $Fe_2O_3$, the molar content of Fe is excessively increased, and $Fe_2O_3$ is likely to be reduced to $Fe_3O_4$ to decrease the resistivity ρ, thereby making it impossible to ensure sufficient insulation properties.

In addition, also when the molar content of Mn is greater than 10 mol % in terms of $Mn_2O_3$, it is impossible to achieve adequately high resistivity ρ, thereby failing to ensure insulation properties.

Moreover, when the molar content of Fe is 25 mol % or more, but less than 35 mol % in terms of $Fe_2O_3$, and when the molar content of Fe is 45 mol % or more, but less than 47 mol % in terms of $Fe_2O_3$, the molar content of Mn in excess of 7.5 mol % in terms of $Mn_2O_3$ in turn causes a decrease in resistivity ρ, thereby making it impossible to ensure desired insulation properties.

Therefore, in the present embodiment, the respective molar contents of Fe and Mn are adjusted so that the molar contents fall within the region X surrounded by the points A through H in FIG. 1 respectively in terms of $Fe_2O_3$ and $Mn_2O_3$.

It is to be noted that while the respective molar contents of Zn and Ni in the ferrite ceramic composition are not to be considered particularly limited, but can be appropriately set depending on the respective molar contents of Fe, Mn, and Cu, the combination is preferably provided so that Zn is 6 to 33 mol % in terms of ZnO, with NiO as the balance.

More specifically, the molar content of Zn is preferably 33 mol % or less in terms of ZnO, because the molar content of Zn in excess of 33 mol % in terms of ZnO has the possibility of lowering the Curie point Tc and failing to guarantee the operation at high temperatures.

On the other hand, the Zn oxide has the effect of contributing to an improvement in magnetic permeability μ, and in order to exert the effect, the molar content of Zn needs to be 6 mol % in terms of ZnO.

Therefore, the molar content of Zn is preferably 6 to 33 mol % in terms of ZnO.

As just described, in the ferrite ceramic composition, the Cu molar content is 0 to 5 mol % in terms of CuO, and when the Fe molar content x mol % in terms of $Fe_2O_3$ and the Mn molar content y mol % in terms of $Mn_2O_3$ are represented by (x, y), the (x, y) falls within the specific region surrounded by the points A through H mentioned above. Thus, even when the ferrite ceramic composition is subjected to co-firing with a Cu material, desired insulation properties can be ensured without causing a decrease in resistivity ρ.

Specifically, favorable insulation properties can be achieved with the resistivity ρ of $10^7$ Ω·cm or more. Thus, it becomes possible to achieve a desired ceramic electronic component which has favorable electrical characteristics such as impedance characteristics.

In addition, the molar content of Zn from 6 to 33 mol % in terms of ZnO provides favorable magnetic permeability, and can ensure an adequate Curie point, and achieve a ceramic electronic component which guarantees the operation under the condition of high temperatures for use.

Next, a ceramic electronic component with the use of the ferrite ceramic composition described above will be described in detail.

Figure 2:
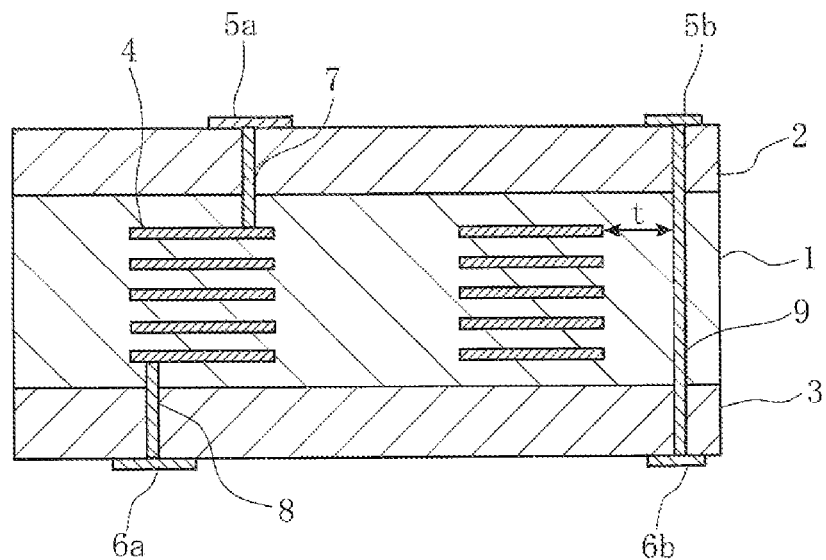
FIG. 2 is a cross-sectional view illustrating an embodiment (first embodiment) of a ceramic multi-layer substrate as a ceramic electronic component according to the present invention.

FIG. 2 is a cross-sectional view illustrating an embodiment (first embodiment) of a ceramic multi-layer substrate as a ceramic electronic component according to the present invention.

More specifically, this ceramic multi-layer substrate has a magnetic layer 1 sandwiched between a pair of non-magnetic layers (a first non-magnetic layer 2 and a second non-magnetic layer 3). The magnetic layer 1 has a coil conductor 4 embedded therein, and first external electrodes 5a, 5b are formed on a principal surface of the first non-magnetic layer 2, whereas second external electrodes 6a, 6b are further formed on a principal surface of the second non-magnetic layer 3. In addition, the first external electrode 5a is electrically connected through a first via electrode 7 to the coil conductor 4, and the coil conductor 4 is electrically connected through a second via electrode 8 to the second external electrode 6a. The first external electrode 5b and the second external electrode 6b are electrically connected through a third via electrode 9 (via electrode).

Further, in the first embodiment, the coil conductor 4 and the first to third via electrodes 7 to 9 are formed from Cu, and the magnetic layer 1 is formed from the above mentioned ferrite ceramic composition according to the present invention.

In addition, the first and second non-magnetic layers 2, 3 are adapted to have an element composition in the same range as for the ferrite ceramic composition, except for containing no Ni oxide. More specifically, in the ferrite ceramic composition, the molar contents of Cu, Fe, and Mn are adapted to fall within the ranges mentioned above in terms of CuO, $Fe_2O_3$, and $Mn_2O_3$, and the balance is formed from a Zn oxide.

As just described, the ceramic multi-layer substrate has the magnetic layer 1 formed from the ferrite ceramic composition according to the present invention, thus allowing desired electrical characteristics to be ensured without oxidizing Cu or reducing $Fe_2O_3$, even in the case of co-firing with the conductive material containing Cu as its main constituent.

In addition, the occurrence of migration can be avoided as much as possible unlike Ag materials, because the coil conductor 4 and the third via electrode 9 are formed from the conductive material containing Cu as its main constituent. Therefore, the gap t can be reduced between the coil conductor 4 and third via electrode 9 with different potential applied thereto, and it becomes possible to reduce the size of the ceramic multi-layer substrate.

In addition, the occurrence of migration can be suppressed as much as possible as described above, and it thus becomes possible to use the component for a DC/DC converter with a DC bias voltage applied between electrodes inside in a preferred manner.

Furthermore, the ceramic multi-layer substrate can reduce the difference in shrinkage behavior during the firing, and ensure a desired mechanical strength, because the non-magnetic material forming the first and second non-magnetic layers 2, 3 is formed in the same composition system as for the magnetic material forming the magnetic layer 1.

Figure 3:
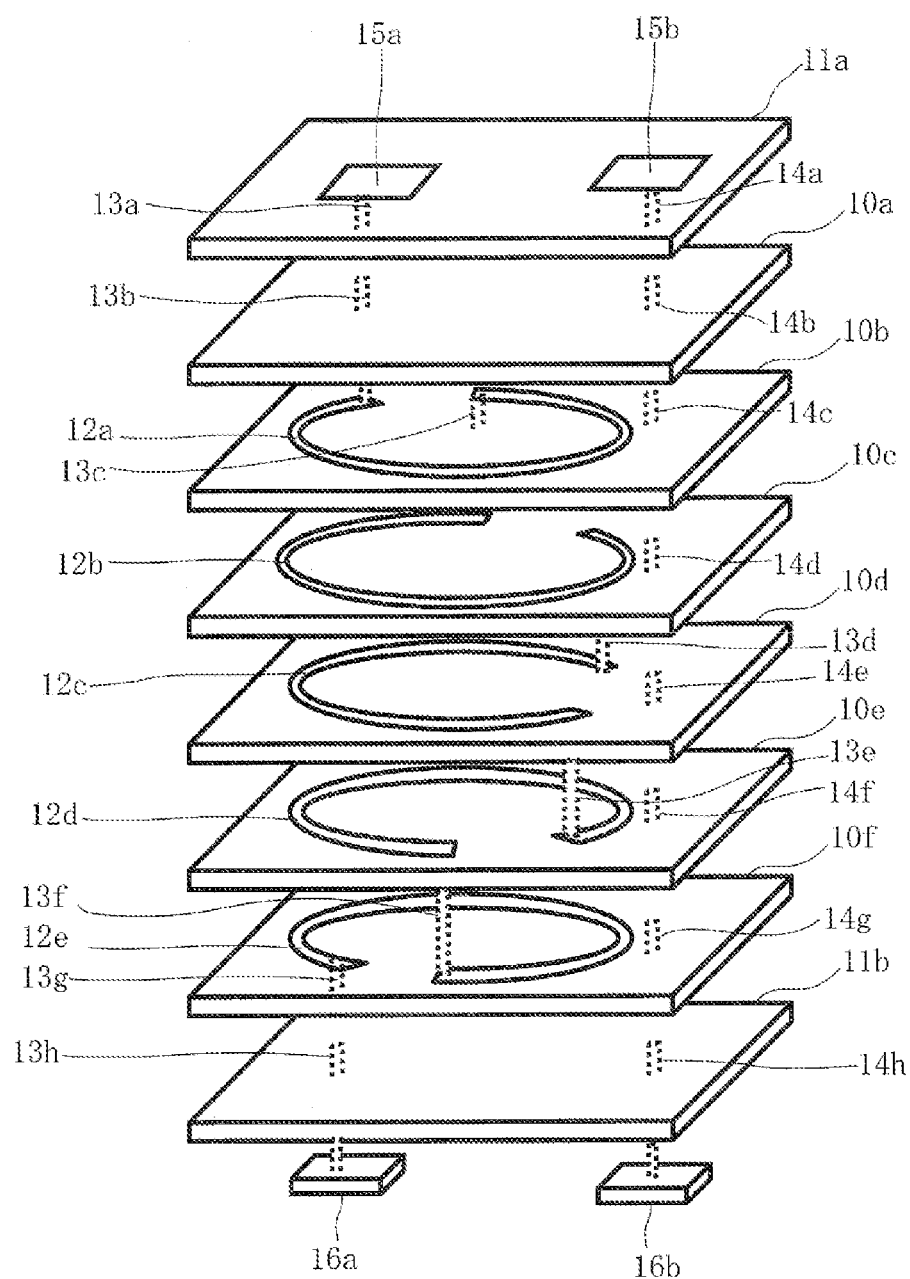
FIG. 3 is a exploded perspective view illustrating a main section according to the first embodiment.

FIG. 3 is an exploded perspective view of the ceramic multi-layer substrate.

A method for producing the ceramic multi-layer substrate will be described below in detail with reference to FIG. 3.

First, a Fe compound such as $Fe_2O_3$, a Zn compound such as ZnO, a Ni compound such as NiO, and if necessary, a Cu compound such as CuO, are prepared as ceramic raw materials. Then, the respective ceramic raw materials are weighed so that the molar content of Cu is 0 to 5 mol % in terms of CuO, whereas Fe and Mn meet the specific region X surrounded by the points A through H in FIG. 1 respectively in terms of $Fe_2O_3$ and $Mn_2O_3$.

Then, these weighed compounds are put in a pot mill along with pure water and balls such as PSZ (partially stabilized zirconia) balls, and subjected to sufficient mixing and grinding in a wet way, and subjected to evaporative drying, and then to calcination at a temperature of 700 to 800° C. for a predetermined period of time.

Then, these calcined powders are put again in a pot mill along with an organic binder such as polyvinyl butyral, an organic solvent such as ethanol and toluene, and PSZ balls, and subjected to sufficient mixing and grinding to prepare ceramic slurry.

Next, the ceramic slurry is subjected to a forming process into the shape of a sheet with the use of a doctor blade method or the like to prepare magnetic ceramic green sheets (hereinafter, simply referred to as "magnetic sheets") 10a to 10f with a predetermined film thickness.

In addition, a Fe compound such as $Fe_2O_3$, a Zn compound such as ZnO, and if necessary, a Cu compound such as CuO, are prepared as ceramic raw materials. Then, the respective ceramic raw materials are weighed so that the molar content of Cu is 0 to 5 mol % in terms of CuO, whereas Fe and Mn fall within the specific region X surrounded by the respective points A through H in FIG. 1 respectively in terms of $Fe_2O_3$ and $Mn_2O_3$.

Then, ceramic green sheets (hereinafter, simply referred to as "non-magnetic sheets") 11a, 11b with a predetermined film thickness are prepared by the same method as described above.

Then, a laser processing machine is used to form via holes in predetermined positions so that the magnetic sheets 10a to 10f and the non-magnetic sheets 11a, 11b are able to be electrically connected to each other.

Next, a conductive paste (hereinafter, referred to as a "Cu paste") is prepared which contains Cu as its main constituent. Then, screen printing is carried out with the use of the Cu paste to form coil patterns 12a to 12e on the magnetic sheets 10b to 10f, and the via holes are filled with the Cu paste to prepare via conductors 13b to 13g (first and second via conductors) and 14b to 14g (third via conductor).

Next, screen printing is carried out with the use of the Cu paste to form electrode films 15a, 15b, 16a, 16b on the non-magnetic sheets 11a, 11b, and the via holes are filled with the Cu paste to prepare via conductors 13a, 13h (first and second via conductors) and 14a, 14h (third via conductor).

Then, these magnetic sheets 10a to 10f are stacked, with the non-magnetic sheets 11a, 11b placed on both upper and lower principal surfaces of the magnetic sheets, and subjected to pressure bonding by application of pressure to prepare a laminated compact.

Thus, the coil patterns 12a to 12e are electrically connected through the via conductors 13c to 13f to form the coil conductor 4 after sintering. The coil pattern 12a is connected to the via conductors 13a, 13b for surface exposure to form the first via electrode 7 after the sintering. The coil pattern 12e is connected to the via conductors 13g, 13h for surface exposure to form the second via electrode 8 after the sintering. In addition, the via conductors 14a to 14h are electrically connected for surface exposure to form the third via electrode 9 after the sintering.

Next, this laminated compact is sufficiently degreased by heating under such an atmosphere in which Cu is not oxidized, then supplied to a firing furnace with an atmosphere therein adjusted with a mixed gas of $N_2$—$H_2$—$H_2O$ so as to be lower than or equal to the equilibrium oxygen partial pressure of Cu—$Cu_2O$, and subjected to firing at 900 to 1050° C. for a predetermined period of time in the firing furnace, thereby providing a sintered body with the coil conductor 4 and first to third via electrodes 7 to 9 embedded in the magnetic layer 1 and first and second non-magnetic layers 2, 3, and the sintered body is cut into a predetermined size to obtain the ceramic multi-layer substrate described above.

As just described, in the first embodiment, even when the ceramic green sheets, and the coil conductors and via conductors containing Cu as their main constituent are subjected to co-firing in a firing atmosphere of lower than or equal to the equilibrium oxygen partial pressure of Cu—$Cu_2O$, a ceramic multi-layer substrate with favorable insulation properties and high reliability can be achieved without oxidizing Cu or reducing Fe. Moreover, because Cu is used for the conductive material without the use of Ag therefor, it becomes possible to avoid the occurrence of migration, the gap t can be reduced between the third via electrode 9 and the coil conductor 4, the ceramic multi-layer substrate can be reduced in size, and it becomes possible to reduce the mounting space.

Figure 4:
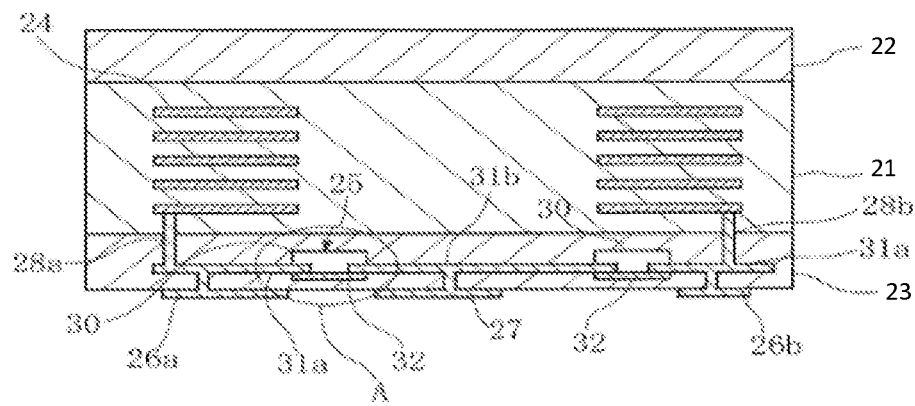
FIG. 4 is a cross-sectional view illustrating a second embodiment of a ceramic multi-layer substrate as a ceramic electronic component according to the present invention.

FIG. 4 is a cross-sectional view illustrating a second embodiment of a ceramic multi-layer substrate as a ceramic electronic component according to the present invention.

This ceramic multi-layer substrate has a magnetic layer 21 sandwiched between first and second non-magnetic layers 22, 23, and the second non-magnetic layer 23 has an ESD protection function.

More specifically, when a charged conductive body, for example, a human body or the like comes into contact with, or close to another conductive body, for example, an electronic device, an intense electrostatic discharge, that is, ESD will be caused. Then, this ESD has the possibility of causing damage to or malfunction of the electronic device.

Therefore, in the second embodiment, an ESD protection element 25 is built in the second non-magnetic layer 23 provided on one principal surface of the magnetic layer 21, such that any excessive voltage generated during discharge is not loaded on another electronic device.

In addition, in recent years, with miniaturization of communication ICs, the resistance to electrostatic discharge has been lowered, and there has been a need for ceramic multi-layer substrates which have an electrostatic discharge protection function.

Therefore, in the second embodiment, the use of the ferrite ceramic composition according to the present invention achieves a ceramic multi-layer substrate preferred for a common-mode choke coil for high-speed serial communications.

This ceramic multi-layer substrate specifically has a coil conductor 24 embedded in the magnetic layer 21, and a pair of input-side external electrodes 26a, 26b, a ground electrode 27, and a pair of output-side external electrodes (denoted by reference numerals 26a', 26b' in FIGS. 6 and 7) are formed on one principal surface of the second non-magnetic layer 23. Further, the coil conductor 24 is connected through via electrodes 28a, 28b between the input-side external electrodes 26a, 26b and the output-side external electrodes, and an ESD protection element 25 is interposed between the input-side and output-side external electrodes, and the ground electrode 27.

Figure 5:
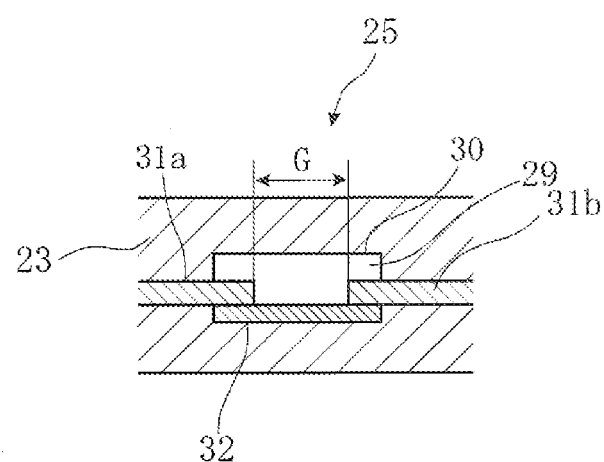
FIG. 5 is a cross-sectional view of a main section according to the second embodiment.

FIG. 5 is an enlarged cross-sectional view of a section A in FIG. 4.

More specifically, for the ESD protection element 25, a cavity section 30 filled with an inert gas 29 is formed in the second non-magnetic layer 23, a pair of discharge electrodes 31a, 31b is placed to be opposed with a predetermined gap G interposed therebetween in the cavity section 30, and the pair of discharge electrodes 31a, 31b is connected therebetween through an auxiliary electrode 32.

This auxiliary electrode 32 is intended to reduce the difference in shrinkage behavior during firing between the discharge electrodes 31a, 31b and the second non-magnetic layer 23, thereby suppressing the generation of structural defects such as delamination or cracks and the variation in characteristics, and a conductive material is dispersed in the non-magnetic material therefor.

Further, in the second embodiment, the conductive materials in coil conductor 24, via electrodes 28a, 28b, discharge electrodes 31a, 31b, and auxiliary electrode 32 are formed from Cu. In addition, the magnetic layer 21 is formed from the above-mentioned ferrite ceramic composition according to the present invention, and the first and second non-magnetic layers 22, 23 are, although no Ni oxide is contained therein, formed in the same element composition system as for the ferrite ceramic composition.

Thus, it becomes possible to ensure favorable insulation properties as in the first embodiment, without oxidizing Cu or reducing $Fe_2O_3$. In addition, in the second embodiment, due to the firing in such a reducing atmosphere in which Cu is not oxidized, the cavity section 30 formed by the firing treatment will be easily filled with the inert gas 29 as will be described later. Therefore, the discharge starting voltage of the ESD protection element 25 can be increased, and a ceramic multi-layer substrate can be thus achieved which is provided with the ESD protection element 25 which has further favorable characteristics.

Figure 6:
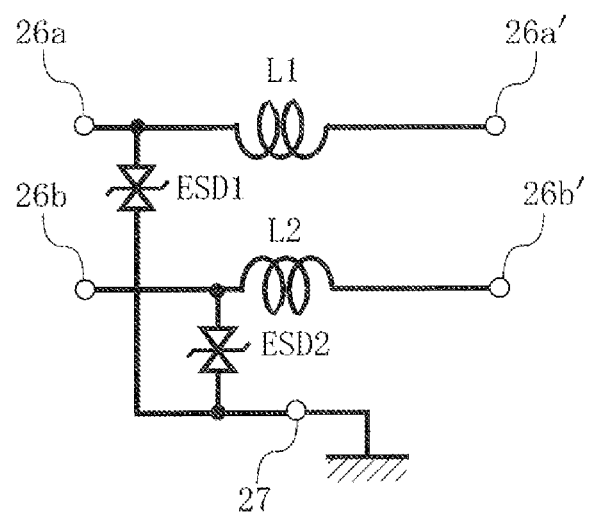
FIG. 6 is an equivalent circuit schematic according to the second embodiment.

FIG. 6 is an equivalent circuit schematic of the ceramic multi-layer substrate in FIG. 4.

More specifically, in the second embodiment, a circuit configuration is provided which has a coil of inductance L1 interposed between one input-side external electrode 26a and one output-side external electrode 26a', a coil of inductance L2 interposed between the other input-side external electrode 26b and the other output-side external electrode 26b', and ESD protection elements ESD1, ESD2 interposed in parallel between the input-side external electrodes 26a, 26b and the ground electrode 27.

Further, in the second embodiment, because the cavity section 30 is filled with the inert gas 29, the discharge starting voltage of the ESD protection element 25 can be increased, and it becomes possible to achieve a ceramic multilayer substrate with the function of a further high-performance ESD protection element.

Figure 7:
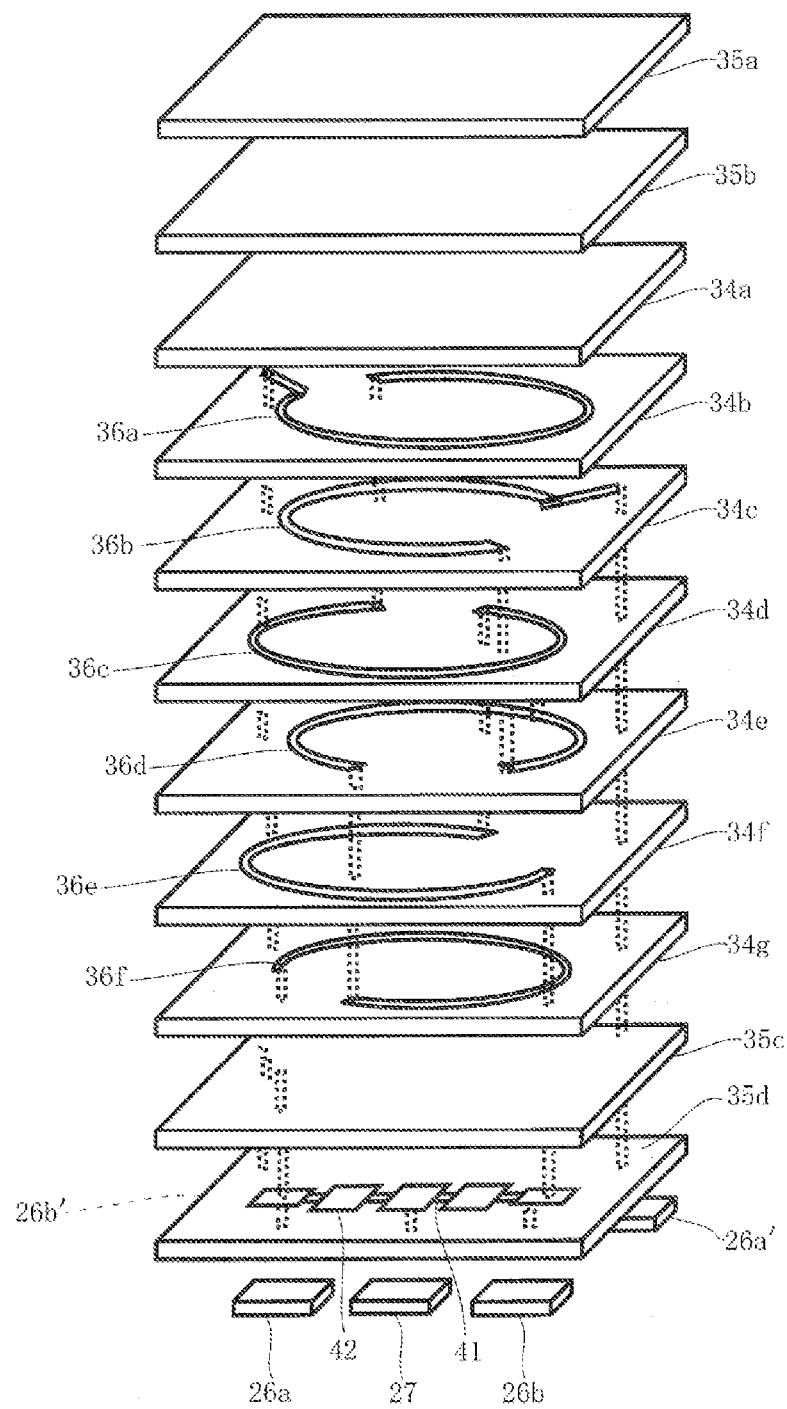
FIG. 7 is a exploded perspective view illustrating a main section according to the second embodiment.

FIG. 7 is an exploded perspective view of the ceramic multi-layer substrate according to the second embodiment.

A method for producing the ceramic multi-layer substrate will be described below in detail with reference to FIG. 7.

First, magnetic sheets 34a to 34g and non-magnetic sheets 35a to 35d are prepared by the same method as in the first embodiment.

Then, a laser processing machine is used to form via holes in predetermined positions so that the magnetic sheets 34a to 34g and the non-magnetic sheets 35a to 35d are able to be electrically connected to each other.

Next, the Cu paste, as well as the resin paste and the mixed paste are prepared, which are used in the first embodiment.

In this case, the resin paste can be prepared by kneading a thermally-degradable resin such as an ethyl cellulose resin, which is brought into an organic solvent.

In addition, the mixed paste can be prepared by the following method.

More specifically, first, prepared are the calcined powder obtained in the preparation of the non-magnetic sheets, a Cu conductive powder with the surface coated with a non-conductive material such as $Al_2O_3$, and an organic solvent. Then, the mixed paste can be prepared in such a way that a mixture is prepared by mixing the calcined powder and the Cu conductive powder to the same extent in terms of volume ratio, and the mixture is brought along with a binder resin into the organic solvent, and subjected to kneading. It is to be noted that the content of the mixture in the mixed paste is preferably on the order of 80 weight % in this case.

It is to be noted that it is in order to avoid a short circuit due to the Cu conductive powders in contact with each other that the surface of the Cu conductive powder is coated with the non-conductive powder such as $Al_2O_3$ in the second embodiment.

Then, screen printing is carried out with the use of the Cu paste to form coil patterns 36a to 36f on the magnetic sheets 34b to 34g, and the via holes are filled with the conductive paste to prepare a number of via hole conductors (indicated by a dashed line in the figure).

Next, a mixed paste is applied on the surface of the non-magnetic sheet 35d to form a mixed section in a predetermined pattern, the Cu paste is further applied to form an electrode film 41, and a resin paste is then applied onto the mixed section to form a resin coating section 42.

In addition, the Cu paste is applied onto the rear surface of the non-magnetic sheet 35d to form each of the input-side and output-side external electrodes 26a, 26b, 26a', 26b' and ground electrode 27.

Then, these magnetic sheets 34a to 34g are stacked, with the non-magnetic sheets 35a to 35d placed on both upper and lower principal surfaces of the magnetic sheets, and subjected to pressure bonding by application of pressure to prepare a laminated compact.

Next, this laminated compact is sufficiently degreased at a predetermined temperature under such an atmosphere in which Cu is not oxidized, then supplied to a firing furnace with an atmosphere therein adjusted with a mixed gas of $N_2$—$H_2$—$H_2O$ so as to be lower than or equal to the equilibrium oxygen partial pressure of Cu—$Cu_2O$, and subjected to firing at 900 to 1050° C. for a predetermined period of time in the firing furnace. Then, this firing causes the resin coating section 42 interposed between the non-magnetic sheet 35c and the non-magnetic sheet 35d to disappear to form the cavity section 30 filled with the inert gas 29. At the same time, the mixed section is subjected to sintering to form the auxiliary electrode 32, and the electrode film 41 is subjected to sintering to form the discharge electrodes 31a, 31b. More specifically, the second non-magnetic layer 23 composed of the sintered non-magnetic sheets 35c, 35d has the ESD protection element 25 built-in, and a sintered body is prepared which has the coil conductor 24, via electrodes 28a, 28b, and ESD protection element 25 embedded in the magnetic layer 21 and the first and second non-magnetic layers 22, 23. Then, this sintered body is cut into a predetermined size to prepare the ceramic multi-layer substrate described above.

As just described, the method for manufacturing the ceramic multi-layer substrate includes: the mixed paste preparation step of mixing the non-magnetic material with the conductive material containing Cu as its main constituent to prepare the mixed paste with the conductive material dispersed in the non-magnetic material; the resin paste preparation step of preparing the resin paste containing the thermally-degradable resin material which disappears by firing; the mixed section formation step of applying the mixed paste onto the non-magnetic sheet 35d to form the mixed section in the predetermined pattern to serve as the auxiliary electrode 32; the electrode film formation step of forming the electrode films 41 in the predetermined pattern to serve as the discharge electrodes 31a, 31b on the non-magnetic sheet 35d with the mixed section formed thereon; and the resin coating section preparation step of applying the resin paste onto the non-magnetic sheet 35d with the electrode films 41 formed thereon to prepare the resin coating section 42 to serve as the cavity section 30, and further, the non-magnetic sheet 35c is stacked on the non-magnetic sheet 35d with the resin coating section 42 formed thereon, and the resin coating section 42 is allowed to disappear to form the cavity section in the firing step. Thus, through the firing in the reducing atmosphere at lower than or equal to the equilibrium oxygen partial pressure of Cu—$Cu_2O$, the cavity section 30 formed by the disappearance of the resin coating section 42 is filled with the inert gas 29, a lower discharge starting voltage can be obtained, and it becomes possible to achieve a ceramic multi-layer substrate which is excellent in ESD protection function.

It is to be noted that the present invention is not to be limited to the embodiments described above. While the ceramic multi-layer substrates have been described in the embodiments, the present invention is not to be limited to the embodiments, but can be extensively used in applications where a ferrite material and a Cu material are subjected to co-firing, and obviously, may have applicability to other ceramic electronic components.

In addition, while the ESD protection elements are formed in the non-magnetic layer in the embodiment described above, a similar function effect can be exerted even when the elements are formed in the magnetic layer. In this case, a mixed paste is prepared which has the Cu conductive powder dispersed in the magnetic material in place of the non-magnetic material. Then, a cavity section can be formed by firing in such a state that the mixed paste is applied onto the magnetic sheet to form a mixed section, then after the formation of an electrode film in a predetermined pattern, the resin paste is applied to prepare a resin coating section, and the magnetic sheet is stacked thereon, and the same ESD protection element as in the second embodiment can be thus built in the magnetic layer.

Next, examples of the present invention will be described specifically.

Example 1

$Fe_2O_3$, $Mn_2O_3$, ZnO, CuO, and NiO were prepared as ceramic raw materials, and the ceramic raw materials were weighed so that the molar contents provided compositions are as shown in Tables 1 to 3. More specifically, the ceramic raw materials were weighed so that the molar contents of $Fe_2O_3$ and $Mn_2O_3$ were varied differently with NiO as the balance, while ZnO and CuO were respectively fixed at 30 mol % and 1 mol %.

Then, these weighed materials were put in a pot mill made of vinyl chloride along with pure water and PSZ balls, subjected to sufficient mixing and grinding in a wet way, and to evaporative drying, and then subjected to calcination at a temperature of 750° C. to obtain a calcined powder.

Then, this calcined powder was put again in a pot mill made of vinyl chloride along with a polyvinyl butyral-based binder (organic binder), ethanol (organic solvent), and PSZ balls, and subjected to sufficient mixing and grinding to obtain ceramic slurry.

Next, a doctor blade method was used to form the ceramic slurry into the shape of a sheet to have a thickness of 25 μm, and this sheet was subjected to punching into a size of 50 mm×50 mm to prepare magnetic sheets.

Then, the thus prepared multiple magnetic sheets were stacked to have a thickness of 1.0 mm in total, heated to 60° C., subjected to pressure bonding by applying a pressure of 100 MPa for 60 seconds, and then cut out into a ring shape of 20 mm in outside diameter and 12 mm in inside diameter to obtain a ceramic compact.

Then, the obtained ceramic compact was sufficiently degreased by heating. Then, a mixed gas of $N_2$—$H_2$—$H_2O$ was supplied to a firing furnace to adjust the oxygen partial pressure to $6.7 \times 10^{-2}$ Pa, and the ceramic compact was thereafter supplied to the firing furnace, and subjected to firing for 2 hours at a temperature of 1000° C., thereby providing ring-shaped samples.

It is to be noted that this oxygen partial pressure of $6.7 \times 10^{-2}$ Pa is the equilibrium oxygen partial pressure of Cu—$Cu_2O$ at 1000° C., and the ceramic compact was thus subjected to firing for 2 hours at the equilibrium oxygen partial pressure of Cu—$Cu_2O$, thereby preparing ring-shaped samples of sample numbers 1 to 104.

Then, for each ring-shaped sample of sample numbers 1 to 104, an annealed copper wire was wound around the sample to reach 20 turns, an impedance analyzer (from Agilent Technologies, E4991A) was used to measure the inductance at a measurement frequency of 1 MHz, and the magnetic permeability α was figured out from the measurement value.

Next, a Cu powder was mixed into an organic vehicle containing terpineol (organic solvent) and ethyl cellulose resin (binder resin), and subjected to kneading with a three-roll mill to prepare a Cu paste.

Next, the Cu paste was applied by screen printing onto surfaces of the magnetic sheets to prepare conductive films in predetermined patterns. Then, the magnetic sheets with the conductive films formed were stacked for a predetermined number of sheets in a predetermined order, sandwiched between the magnetic sheets with no conductive films formed, subjected to pressure bonding, and cut into a predetermined size to obtain a laminated compact.

Then, a mixed gas of $N_2$—$H_2$—$H_2O$ was supplied to a firing furnace to adjust the oxygen partial pressure to $6.7 \times 10^{-2}$ Pa (the equilibrium oxygen partial pressure of Cu—$Cu_2O$ at 1000° C.), and the laminated compact was put in the firing furnace, sufficiently degreased, and then subjected to firing for 2 hours at a temperature of 1000° C. to obtain a ceramic sintered body with internal electrodes embedded therein.

Then, this ceramic sintered body was put in a pot along with water, for polishing end surfaces with the use of a centrifugal barrel machine to prepare a ceramic body. Thereafter, a conductive paste for external electrodes, containing Cu or the like as its main constituent, was applied onto both ends of the ceramic body, dried, and then subjected to a burning treatment at a temperature of 900° C. in a firing furnace with the oxygen partial pressure adjusted to 4.3× $10^{-3}$ Pa, thereby preparing samples of sample numbers 1 to 104 for resistivity measurement. It is to be noted that the oxygen partial pressure: $4.3 \times 10^{-3}$ Pa is the equilibrium oxygen partial pressure of Cu—Cu$_2$O at a temperature of 900° C. Samples of sample numbers 1 to 104 for resistivity measurement were prepared by carrying out the burning treatment at a temperature of 750° C. in a firing furnace with the oxygen partial pressure adjusted to $2.7 \times 10^{-5}$ Pa. It is to be noted that the oxygen partial pressure: $2.7 \times 10^{-5}$ Pa is the equilibrium oxygen partial pressure of Cu—Cu$_2$O at a temperature of 750° C.

The external dimensions of the samples for resistivity measurement were 3.0 mm in length, 3.0 mm in width, and 1.0 mm in thickness.

Figure 8:
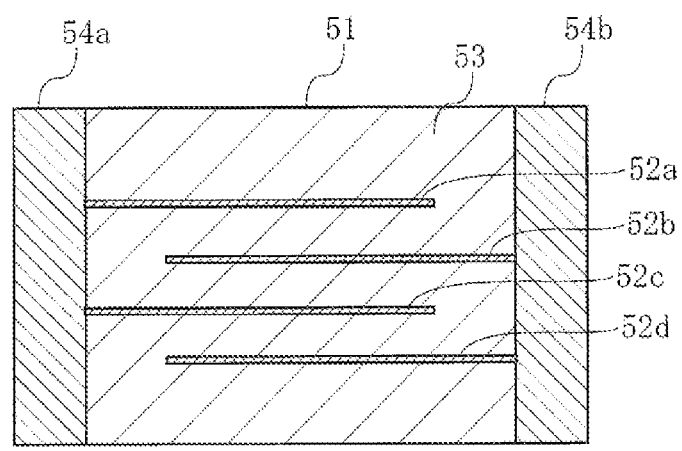
FIG. 8 is a cross-sectional view of a sample for resistivity measurement, prepared in Example 1.

FIG. 8 is a cross-sectional view of a sample for resistivity measurement, where internal electrodes 52a to 52d are embedded in a magnetic layer 53 so as to alternate extracted parts in a ceramic body 51, and external electrodes 54a, 54b are formed on both end surfaces of the ceramic body 51.

Next, for the samples of sample numbers 1 to 104 for resistivity measurement, a voltage of 50 V was applied for 30 seconds to the external electrodes 54a, 54b to measure the current during the voltage application. Then, the resistance was calculated from the measurement value, and the logarithm log ρ of the resistivity (hereinafter, referred to as "resistivity log ρ") was calculated from the sample dimensions.

Tables 1 to 3 show the ferrite compositions and measurement results for sample numbers 1 to 104.

TABLE 1

| Sample Number | Ferrite Composition (mol %) | | | | | Electrical Characteristics | |
|---|---|---|---|---|---|---|---|
| | Fe$_2$O$_3$ | Mn$_2$O$_3$ | ZnO | CuO | NiO | Resistivity log ρ (ρ: Ω · cm) | Magnetic Permeability μ (—) |
| 1* | 49 | 0 | 30 | 1 | 20 | 2.8 | 350 |
| 2* | 49 | 1 | 30 | 1 | 19 | 3.3 | 400 |
| 3* | 49 | 2 | 30 | 1 | 18 | 3.4 | 600 |
| 4* | 49 | 5 | 30 | 1 | 15 | 3.4 | 750 |
| 5* | 49 | 7.5 | 30 | 1 | 12.5 | 3.4 | 900 |
| 6* | 49 | 10 | 30 | 1 | 10 | 3.4 | 1100 |
| 7* | 49 | 13 | 30 | 1 | 7 | 3.3 | 1250 |
| 8* | 49 | 15 | 30 | 1 | 5 | 3.1 | 1450 |
| 9* | 48 | 0 | 30 | 1 | 21 | 4.4 | 290 |
| 10* | 48 | 1 | 30 | 1 | 20 | 5.9 | 330 |
| 11* | 48 | 2 | 30 | 1 | 19 | 6.3 | 500 |
| 12* | 48 | 5 | 30 | 1 | 16 | 6.1 | 640 |
| 13* | 48 | 7.5 | 30 | 1 | 13.5 | 5.9 | 760 |
| 14* | 48 | 10 | 30 | 1 | 11 | 5.6 | 900 |
| 15* | 48 | 13 | 30 | 1 | 8 | 5 | 1050 |
| 16* | 48 | 15 | 30 | 1 | 6 | 4.3 | 1250 |
| 17* | 47 | 0 | 30 | 1 | 22 | 5.3 | 235 |
| 18 | 47 | 1 | 30 | 1 | 21 | 7 | 260 |
| 19 | 47 | 2 | 30 | 1 | 20 | 7.5 | 400 |
| 20 | 47 | 5 | 30 | 1 | 17 | 7.3 | 520 |
| 21 | 47 | 7.5 | 30 | 1 | 14.5 | 7 | 625 |
| 22* | 47 | 10 | 30 | 1 | 12 | 6.4 | 750 |
| 23* | 47 | 13 | 30 | 1 | 9 | 5.6 | 880 |
| 24* | 47 | 15 | 30 | 1 | 7 | 4.9 | 1050 |
| 25* | 46 | 0 | 30 | 1 | 23 | 5.9 | 195 |
| 26 | 46 | 1 | 30 | 1 | 22 | 7.4 | 215 |
| 27 | 46 | 2 | 30 | 1 | 21 | 7.6 | 320 |
| 28 | 46 | 5 | 30 | 1 | 18 | 7.5 | 430 |
| 29 | 46 | 7.5 | 30 | 1 | 15.5 | 7.3 | 520 |
| 30* | 46 | 10 | 30 | 1 | 13 | 6.8 | 630 |
| 31* | 46 | 13 | 30 | 1 | 10 | 6 | 730 |
| 32* | 46 | 15 | 30 | 1 | 8 | 5.2 | 880 |
| 33* | 45 | 0 | 30 | 1 | 24 | 6.2 | 165 |
| 34 | 45 | 1 | 30 | 1 | 23 | 7.7 | 180 |
| 35 | 45 | 2 | 30 | 1 | 22 | 7.9 | 250 |
| 36 | 45 | 5 | 30 | 1 | 19 | 7.8 | 340 |
| 37 | 45 | 7.5 | 30 | 1 | 16.5 | 7.6 | 420 |
| 38 | 45 | 10 | 30 | 1 | 14 | 7.1 | 520 |
| 39* | 45 | 13 | 30 | 1 | 11 | 6.3 | 600 |
| 40* | 45 | 15 | 30 | 1 | 9 | 5.4 | 720 |

*outside the scope of the present invention

TABLE 2

| Sample Number | Ferrite Composition (mol %) | | | | | Electrical Characteristics | |
|---|---|---|---|---|---|---|---|
| | | | | | | Resistivity log ρ | Magnetic Permeability μ |
| | Fe$_2$O$_3$ | Mn$_2$O$_3$ | ZnO | CuO | NiO | (ρ: Ω · cm) | (—) |
| 41* | 44 | 0 | 30 | 1 | 25 | 6.4 | 145 |
| 42 | 44 | 1 | 30 | 1 | 24 | 7.9 | 155 |
| 43 | 44 | 2 | 30 | 1 | 23 | 8 | 210 |
| 44 | 44 | 5 | 30 | 1 | 20 | 8 | 280 |
| 45 | 44 | 7.5 | 30 | 1 | 17.5 | 7.8 | 340 |
| 46 | 44 | 10 | 30 | 1 | 15 | 7.3 | 420 |
| 47* | 44 | 13 | 30 | 1 | 12 | 6.5 | 490 |
| 48* | 44 | 15 | 30 | 1 | 10 | 5.7 | 590 |
| 49* | 42 | 0 | 30 | 1 | 27 | 6.6 | 115 |
| 50 | 42 | 1 | 30 | 1 | 26 | 7.9 | 125 |
| 51 | 42 | 2 | 30 | 1 | 25 | 8.2 | 160 |
| 52 | 42 | 5 | 30 | 1 | 22 | 8.2 | 205 |
| 53 | 42 | 7.5 | 30 | 1 | 19.5 | 7.9 | 235 |
| 54 | 42 | 10 | 30 | 1 | 17 | 7.5 | 280 |
| 55* | 42 | 13 | 30 | 1 | 14 | 6.7 | 340 |
| 56* | 42 | 15 | 30 | 1 | 12 | 5.9 | 420 |
| 57* | 40 | 0 | 30 | 1 | 29 | 6.5 | 100 |
| 58 | 40 | 1 | 30 | 1 | 28 | 7.9 | 108 |
| 59 | 40 | 2 | 30 | 1 | 27 | 8 | 130 |
| 60 | 40 | 5 | 30 | 1 | 24 | 8 | 160 |
| 61 | 40 | 7.5 | 30 | 1 | 21.5 | 7.8 | 185 |
| 62 | 40 | 10 | 30 | 1 | 19 | 7.3 | 215 |
| 63* | 40 | 13 | 30 | 1 | 16 | 6.5 | 260 |
| 64* | 40 | 15 | 30 | 1 | 14 | 5.8 | 320 |
| 65* | 35 | 0 | 30 | 1 | 34 | 6.1 | 80 |
| 66 | 35 | 1 | 30 | 1 | 33 | 7.7 | 85 |
| 67 | 35 | 2 | 30 | 1 | 32 | 8 | 94 |
| 68 | 35 | 5 | 30 | 1 | 29 | 8 | 110 |
| 69 | 35 | 7.5 | 30 | 1 | 26.5 | 7.5 | 125 |
| 70 | 35 | 10 | 30 | 1 | 24 | 7 | 150 |
| 71* | 35 | 13 | 30 | 1 | 21 | 6.2 | 180 |
| 72* | 35 | 15 | 30 | 1 | 19 | 5.7 | 235 |
| 73* | 30 | 0 | 30 | 1 | 39 | 5.7 | 65 |
| 74 | 30 | 1 | 30 | 1 | 38 | 7.3 | 69 |
| 75 | 30 | 2 | 30 | 1 | 37 | 7.7 | 75 |
| 76 | 30 | 5 | 30 | 1 | 34 | 7.4 | 85 |
| 77 | 30 | 7.5 | 30 | 1 | 31.5 | 7.1 | 95 |
| 78* | 30 | 10 | 30 | 1 | 29 | 6.7 | 110 |
| 79* | 30 | 13 | 30 | 1 | 26 | 6 | 130 |
| 80* | 30 | 15 | 30 | 1 | 24 | 5.3 | 175 |

*outside the scope of the present invention

TABLE 3

| Sample Number | Ferrite Composition (mol %) | | | | | Electrical Characteristics | |
|---|---|---|---|---|---|---|---|
| | | | | | | Resistivity log ρ | Magnetic Permeability μ |
| | Fe$_2$O$_3$ | Mn$_2$O$_3$ | ZnO | CuO | NiO | (ρ: Ω · cm) | (—) |
| 81* | 25 | 0 | 30 | 1 | 44 | 5.2 | 51 |
| 82 | 25 | 1 | 30 | 1 | 43 | 7 | 54 |
| 83 | 25 | 2 | 30 | 1 | 42 | 7.3 | 59 |
| 84 | 25 | 5 | 30 | 1 | 39 | 7.1 | 67 |
| 85 | 25 | 7.5 | 30 | 1 | 36.5 | 7 | 73 |
| 86* | 25 | 10 | 30 | 1 | 34 | 6.4 | 88 |
| 87* | 25 | 13 | 30 | 1 | 31 | 5.6 | 105 |
| 88* | 25 | 15 | 30 | 1 | 29 | 4.9 | 140 |
| 89* | 20 | 0 | 30 | 1 | 49 | 4.6 | 35 |
| 90* | 20 | 1 | 30 | 1 | 48 | 6.2 | 38 |
| 91* | 20 | 2 | 30 | 1 | 47 | 6.7 | 42 |
| 92* | 20 | 5 | 30 | 1 | 44 | 6.3 | 50 |
| 93* | 20 | 7.5 | 30 | 1 | 41.5 | 5.9 | 55 |
| 94* | 20 | 10 | 30 | 1 | 39 | 5.6 | 70 |
| 95* | 20 | 13 | 30 | 1 | 36 | 5 | 87 |

TABLE 3-continued

| Sample Number | Ferrite Composition (mol %) | | | | | Resistivity log ρ | Magnetic Permeability μ |
|---|---|---|---|---|---|---|---|
| | $Fe_2O_3$ | $Mn_2O_3$ | ZnO | CuO | NiO | (ρ: Ω · cm) | (—) |
| 96* | 20 | 15 | 30 | 1 | 34 | 4.4 | 120 |
| 97* | 15 | 0 | 30 | 1 | 54 | 3.9 | 18 |
| 98* | 15 | 1 | 30 | 1 | 53 | 5.4 | 20 |
| 99* | 15 | 2 | 30 | 1 | 52 | 5.8 | 25 |
| 100* | 15 | 5 | 30 | 1 | 49 | 5.4 | 33 |
| 101* | 15 | 7.5 | 30 | 1 | 46.5 | 5 | 40 |
| 102* | 15 | 10 | 30 | 1 | 44 | 4.5 | 55 |
| 103* | 15 | 13 | 30 | 1 | 41 | 3.8 | 70 |
| 104* | 15 | 15 | 30 | 1 | 39 | 3.2 | 100 |

*outside the scope of the present invention

Sample numbers 1 to 17, 22 to 25, 30 to 33, 39 to 41, 47 to 49, 55 to 57, 63 to 65, 71 to 73, 78 to 81, and 86 to 104 fall outside the region of the shaded area X in FIG. 1, thus resulting in small resistivity log ρ with the resistivity log ρ less than 7, and failing to achieve desired insulation properties.

In contrast, it has been determined that sample numbers 18 to 21, 26 to 29, 34 to 38, 42 to 46, 50 to 54, 58 to 62, 66 to 70, 74 to 77, and 82 to 85 fall within the region surrounded by the shaded area X in FIG. 1, thus resulting in resistivity log ρ of 7 or more, achieving favorable insulation properties, and also achieving a practically adequate value of 50 or more for the magnetic permeability μ.

Example 2

The ceramic raw materials were weighed so that the molar contents of $Fe_2O_3$ and $Mn_2O_3$ were respectively 44 mol % and 5 mol % within the scope of the present invention, further, the molar content of ZnO was 30 mol %, CuO was varied differently, and the balance was NiO, as shown in Table 4. Then, ring-shaped samples and samples for resistivity measurement from sample number 201 to sample number 209 were prepared by the same method and procedure as in Example 1 except for the above.

Then, for sample numbers 201 to 209, the resistivity log ρ and the magnetic permeability were measured by the same method and procedure as in Example 1.

Table 4 shows the ferrite compositions and measurement results for sample numbers 201 to 209.

Sample numbers 207 to 209 have the molar content of CuO in excess of 5 mol %, thus resulting in small resistivity log ρ with the resistivity log ρ less than 7, and failing to achieve desired insulation properties.

In contrast, sample numbers 201 to 206 with the CuO molar content from 0 to 5 mol % fall within the scope of the present invention, thus resulting in resistivity log ρ of 7 or more, thereby achieving favorable insulation properties, and achieving favorable results of 210 or more for the magnetic permeability μ.

Example 3

Ring-shaped samples and samples for resistivity measurement from sample number 301 to sample number 309 were prepared by the same method and procedure as in Example 1, except that the ceramic raw materials were weighed so that the molar contents of $Fe_2O_3$, $Mn_2O_3$, and CuO were respectively 44 mol %, 5 mol %, and 1 mol % within the scope of the present invention, the molar content of ZnO was varied differently, and the balance was NiO, as shown in Table 5.

Then, for sample numbers 301 to 309, the resistivity log ρ and the magnetic permeability μ were measured by the same method and procedure as in Example 1.

In addition, for sample numbers 301 to 309, a magnetic field of 1 T (tesla) was applied with the use of a vibrating sample magnetometer (Type VSM-5-15 from Toei Industry Co., Ltd.) to measure the temperature dependence of saturation magnetization. Then, the Curie point Tc was figured out from the temperature dependence of saturation magnetization.

TABLE 4

| Sample Number | Ferrite Composition (mol %) | | | | | Resistivity log ρ | Magnetic Permeability μ |
|---|---|---|---|---|---|---|---|
| | $Fe_2O_3$ | $Mn_2O_3$ | ZnO | CuO | NiO | (ρ: Ω · cm) | (—) |
| 201 | 44 | 5 | 30 | 0 | 21 | 7.8 | 210 |
| 202 | 44 | 5 | 30 | 1 | 20 | 8 | 280 |
| 203 | 44 | 5 | 30 | 2 | 19 | 8.2 | 310 |
| 204 | 44 | 5 | 30 | 3 | 18 | 7.9 | 325 |
| 205 | 44 | 5 | 30 | 4 | 17 | 7.5 | 310 |
| 206 | 44 | 5 | 30 | 5 | 16 | 7.1 | 315 |
| 207* | 44 | 5 | 30 | 6 | 15 | 6.1 | 320 |
| 208* | 44 | 5 | 30 | 7 | 14 | 4.9 | 300 |
| 209* | 44 | 5 | 30 | 8 | 13 | 4.1 | 305 |

*outside the scope of the present invention

Table 5 shows the ferrite compositions and measurement results for sample numbers 301 to 309.

TABLE 5

| Sample | Ferrite Composition (mol %) | | | | | Electrical Characteristics | | |
|---|---|---|---|---|---|---|---|---|
| | | | | | | Resistivity log ρ | Magnetic Permeability μ | Curie Point Tc |
| Number | Fe$_2$O$_3$ | Mn$_2$O$_3$ | ZnO | CuO | NiO | (ρ: Ω · cm) | (—) | (° C.) |
| 301*** | 44 | 5 | 1 | 1 | 49 | 7.1 | 15 | 550 |
| 302*** | 44 | 5 | 3 | 1 | 47 | 7.3 | 20 | 515 |
| 303 | 44 | 5 | 6 | 1 | 44 | 7.4 | 35 | 465 |
| 304 | 44 | 5 | 10 | 1 | 40 | 7.6 | 55 | 420 |
| 305 | 44 | 5 | 15 | 1 | 35 | 7.6 | 110 | 340 |
| 306 | 44 | 5 | 25 | 1 | 25 | 7.7 | 230 | 275 |
| 307 | 44 | 5 | 30 | 1 | 20 | 8 | 300 | 165 |
| 308 | 44 | 5 | 33 | 1 | 17 | 8.1 | 355 | 130 |
| 309** | 44 | 5 | 35 | 1 | 15 | 8 | 400 | 110 |

**outside the scope of the present invention
***outside the scope of the present invention It has been determined that sample number 309 has, because of the ZnO molar content in excess of 33 mol %, favorable resistivity log ρ and magnetic permeability μ, but lower Curie point Tc of 110° C. as compared with the other samples.

In addition, sample numbers 301 and 302 have, because of the ZnO molar contents less than 6 mol %, favorable resistivity log ρ and Curie point Tc, but magnetic permeability μ decreased down to 20 or less.

In contrast, it has been determined that sample numbers 303 to 308 can, because of the ZnO molar contents from 6 to 33 mol %, guarantee the operation under high temperature on the order of 130° C. with the Curie point Tc of 165° C. or higher, and also achieve practical magnetic permeability μ with the magnetic permeability μ of 35 or more.

Thus, it has been confirmed that while the magnetic permeability μ is increased with the increase in ZnO molar content, the Curie point Tc is lowered when the ZnO molar content is excessively increased.

Example 4

While preparing the ceramic multi-layer substrate shown in FIG. 2, the distance between the third via electrode and the coil conductor (hereinafter, referred to as a "via-coil distance") was varied differently to evaluate the moisture resistance.

Preparation of Sample According to Present Invention

First, the magnetic sheets of sample number 203 prepared in Example 2 were prepared as magnetic sheets.

Next, non-magnetic sheets were prepared in the following way.

First, ceramic raw materials were weighed for Fe$_2$O$_3$: 44.0 mol %, Mn$_2$O$_3$: 5.0 mol %, CuO: 2.0 mol %, and balance: ZnO. Then, non-magnetic sheets were prepared by the same method as for the magnetic sheets mentioned in Example 1 to prepare non-magnetic sheets of 50 mm in length×50 mm in width.

Next, a laser processing machine was used to form via holes in predetermined positions of the magnetic sheets and non-magnetic sheets.

Then, screen printing was carried out with the use of the Cu paste to form coil patterns on the magnetic sheets, and the via holes were filled with the Cu paste to prepare via conductors.

Then, these magnetic sheets were stacked, with the non-magnetic sheets placed on both upper and lower principal surfaces of the magnetic sheets, subjected to pressure bonding by applying a pressure of 100 MPa for 60 seconds while heating to 60° C., and cut into a predetermined size to prepare a laminated compact.

Next, after sufficient degreasing by heating under an atmosphere in which Cu was not oxidized, the laminated compact was supplied to a firing furnace with the oxygen partial pressure adjusted to 6.7×10$^{-2}$ Pa with a mixed gas of N$_2$—H$_2$—H$_2$O, and subjected to firing for 2 hours at a temperature of 1000° C. to obtain a ceramic sintered body.

Then, electrolytic plating was applied to form a Ni film and a Sn film sequentially on the surfaces of the external electrodes, thereby preparing samples of sample numbers 203a to 203d. The external dimensions of the prepared samples were each 2.5 mm in length, 2.0 mm in width, and 0.55 mm in thickness.

In this case, the via-coil distance was 300 μm for sample number 203a, 250 μm for sample number 203b, 200 μm for sample number 203c, and 150 μm for sample number 203d.

Preparation of Sample According to Comparative Example

The magnetic sheets of sample number 209 prepared in Example 2 were prepared as magnetic sheets.

Next, non-magnetic sheets were prepared in the following way.

First, ceramic raw materials were weighed for Fe$_2$O$_3$: 44.0 mol %, Mn$_2$O$_3$: 5.0 mol %, CuO: 8.0 mol %, and balance: ZnO. Then, non-magnetic sheets were prepared by the same method as for the magnetic sheets mentioned in Example 1 to prepare non-magnetic sheets of 50 mm in length×50 mm in width.

Next, a laser processing machine was used to form via holes in predetermined positions of the magnetic sheets and non-magnetic sheets.

Next, a conductive paste (hereinafter, referred to as a "Ag paste") was prepared, containing Ag as its main constituent. Then, screen printing was carried out with the use of the Ag paste to form coil patterns on the magnetic sheets, and the via holes were filled with the Ag paste to prepare via conductors.

Then, these magnetic sheets were stacked, with the non-magnetic sheets placed on both upper and lower principal surfaces of the magnetic sheets, subjected to pressure bonding by applying a pressure of 100 MPa for 60 seconds while heating to 60° C., and cut into a predetermined size to prepare a laminated compact.

Next, the laminated compact was sufficiently degreased by heating under the atmosphere, and then subjected to firing for 2 hours at a temperature of 900° C. to prepare a ceramic sintered body.

Thereafter, electrolytic plating was applied by the same method as for the samples according to the present invention to form a Ni film and a Sn film sequentially on the electrode surfaces, thereby providing samples of sample numbers 209a to 209d.

In this case, the via-coil distance was 300 μm for sample number 209a, 250 μm for sample number 209b, 200 μm for sample number 209c, and 150 μm for sample number 209d, so as to correspond to the samples according to the present invention.

Evaluation of Sample

For each sample of sample numbers 203a to 203d and 209a to 209d, a direct-current voltage of 9 V was applied to carry out a moisture-resistance loading test under a high-humidity environment at a temperature of 85° C. and a humidity of 85% RH.

Then, an electrometer (R8340A from Advantest Corporation) was used to measure the initial insulation resistance log IR before starting the test, and each insulation resistance at log IR 500 hours, 1000 hours, and 2000 hours after starting the test.

Table 6 shows the measurement results.

It is to be noted that with the initial insulation resistance as a reference, the sample was regarded as being excellent (○) when the rate of decrease in resistance was within 10%, the sample was regarded as being good (Δ) when the rate of decrease in resistance was 10% or more and less than 20%, the sample was regarded as being defective (x) when the rate of decrease in resistance was 20% or more.

TABLE 6

| Sample Number | Via-Coil Distance (μm) | Evaluation of Rate of Decrease in Resistance | | |
| --- | --- | --- | --- | --- |
| | | Lapse of 500 hours | Lapse of 1000 hours | Lapse of 2000 hours |
| 203a | 300 | ○ | ○ | ○ |
| 203b | 250 | ○ | ○ | ○ |
| 203c | 200 | ○ | ○ | ○ |
| 203d | 150 | ○ | ○ | ○ |
| 209a* | 300 | ○ | ○ | ○ |
| 209b* | 250 | ○ | ○ | ○ |
| 209c* | 200 | ○ | ○ | X |
| 209d* | 150 | Δ | X | X |

*outside the scope of the present invention

Sample numbers 209a, 209b were, because of the large via-coil distances of 300 μm and 250 μm, favorable even after a lapse of 2000 hours, whereas sample number 209c was, because of the small via-coil distance of 200 μm, defective with the insulation resistance log IR decreased by 20% or more after a lapse of 2000 hours. In addition, sample number 209d was, because of the further small via-coil distance of 150 μm, defective with the rate of decrease in resistance already up to 10% or more in insulation resistance log IR after a lapse of 500 hours, and the rate of decrease in resistance up to 20% or more in insulation resistance log IR after a lapse of 1000 hours.

In contrast, sample numbers 203a to 203d as the samples according to the present invention succeeded in achieving highly-reliable ceramic multi-layer substrates without causing migration as in the case of using Ag for the conductive material, because of the use of Cu for both the coil conductors and via electrodes, and the firing carried out in an atmosphere without oxidizing Cu or reducing $Fe_2O_3$.

Example 5

The ceramic multi-layer substrate shown in FIG. 4 was prepared to evaluate discharge characteristics.

Preparation of Sample According to Present Invention

The magnetic sheets of sample number 203 prepared in Example 2 were prepared as magnetic sheets.

In addition, the non-magnetic sheets prepared in Example 4 were prepared.

In addition, a mixed paste was prepared by the following method.

More specifically, prepared were the calcined powder for non-magnetic bodies, prepared in Example 4, and a Cu powder with the surface coated with $Al_2O_3$.

Then, the calcined powder and the Cu powder were mixed so that the contents thereof was 1:1 in volume % to prepare a mixed powder. Then, this mixed powder was subjected to kneading with a three-roll mill with the addition of a binder resin and an organic solvent to the mixed powder, thereby preparing a mixed paste. It is to be noted that the content of the mixed powder in the mixed paste was adjusted to be 80 weight %.

In addition, ethyl cellulose as a thermally-degradable resin was, with the addition of a predetermined amount of solvent thereto, subjected to kneading with a three-roll mill to prepare a resin paste.

Next, a laser processing machine was used to form via holes in predetermined positions of the magnetic sheets and non-magnetic sheets.

Then, screen printing was carried out with the use of the Cu paste to form coil patterns on the magnetic sheets, and the via holes were filled with the Cu paste to prepare via conductors.

Then, the mixed paste was applied onto a surface of the non-magnetic sheet to form a mixed section in a predetermined pattern, and a Cu paste for discharge electrodes was further applied to form electrode films in predetermined patterns. Thereafter, the resin paste was applied to prepare a resin coating section in a predetermined pattern to serve as a cavity section.

Then, these magnetic sheets and non-magnetic sheets were stacked in a predetermined order, subjected to pressure bonding by applying a pressure of 100 MPa for 60 seconds while heating to 60° C., and cut into a predetermined size to prepare a laminated compact.

Next, after sufficient degreasing by heating under an atmosphere in which Cu was not oxidized, the laminated compact was supplied to a firing furnace with the oxygen partial pressure adjusted to $6.7 \times 10^{-2}$ Pa with a mixed gas of $N_2$—$H_2$—$H_2O$, and subjected to firing for 2 hours at a temperature of 1000° C. to obtain a ceramic sintered body.

Then, electrolytic plating was applied to form a Ni film and a Sn film sequentially on the surfaces of the external electrodes, thereby preparing a sample of sample number 203e.

Preparation of Sample According to Comparative Example

The magnetic sheets of sample number 209 prepared in Example 2 were prepared. Then, a sample of sample number 209e was prepared by the same method and procedure as for the sample according to the present invention, except for the use of the non-magnetic sheets and calcined powder for the non-magnetic sheets, which were prepared in Example 4, the use of Ag in place of Cu as the conductive material, and the atmosphere used as a firing atmosphere.

Evaluation of Sample

In conformity with IEC61000-4-2 of IEC standards, a discharge test was carried out. More specifically, contact discharge was carried out at 8 kV, 4 kV, 3 kV, and 2 kV to measure the discharge voltage waveforms, and measure the peak voltage, and the voltage observed 30 ns after the peak voltage. It is to be noted that the voltage application was carried out 20 times.

Then, the sample with the maximum value of the peak voltage Vpeak less than 700 V was regarded as being good (○), whereas the sample with the maximum value of 700 V or more was regarded as being defective (x). In addition, the sample with the voltage of 100 V or lower observed after 30 ns was regarded as being good (○), whereas the sample with the voltage in excess of 100 V was regarded as being defective (x).

Table 7 shows the measurement results. The evaluation was determined as being good (○) when both the peak voltage and the voltage observed after 30 ns were good, or as being defective (x) when either one of the voltages was detective.

Table 7 shows the evaluation results.

TABLE 7

| Sample Number | Discharge Voltage (kV) | | | |
|---|---|---|---|---|
| | 8 | 4 | 3 | 2 |
| 203e | ○ | ○ | ○ | ○ |
| 209e* | ○ | ○ | ○ | X |

*outside the scope of the present invention

As is clear from Table 7, sample number 209e as the sample according to the comparative example failed to cause the ESD protection element to respond unless the contact discharge reached 3 kV or higher, because of the cavity section filled with air.

In contrast, it has been determined that sample number 203e as the sample according to the present invention caused the ESD protection element to sensitively respond when the contact discharge reached 2 kV, because of the cavity section filled with an inert gas.

More specifically, according to the present invention, because of the low voltage for protected operation and the high protection performance against ESD, damage can be suppressed to ICs for serial communications, etc., which are connected to a common-mode choke coil.

INDUSTRIAL APPLICABILITY

The material containing Cu as its main constituent can be used for the coil conductors and the via electrodes, and ceramic electronic components can be achieved such as ceramic multi-layer substrates which are able to be reduced in size and able to improve an ESD protection function.

The invention claimed is:

1. A ceramic electronic component comprising
a coil conductor and a via electrode placed away from the coil conductor, the coil conductor and the via electrode being embedded in a magnetic layer,
the coil conductor and the via electrode being formed from a conductive material containing Cu as a main constituent, and the magnetic layer being formed from a ferrite ceramic composition,
the ferrite ceramic composition containing at least Fe, Mn, Ni, and Zn, a Cu molar content thereof being 0 to 5 mol % in terms of CuO, and when a Fe molar content x mol % in terms of $Fe_2O_3$ and a Mn molar content y mol % in terms of $Mn_2O_3$ are represented by (x, y), the (x, y) falls within a region surrounded by A (25, 1), B (47, 1), C (47, 7.5), D (45, 7.5), E (45, 10), F (35, 10), G (35, 7.5), and H (25,7.5), wherein
the coil conductor is connected to a first external electrode on a first principal surface of the ceramic electronic component and a second external electrode on a second principal surface of the ceramic electronic component, and
the via electrode is connected to another first external electrode on the first principal surface of the ceramic electronic component and another second external electrode on the second principal surface of the ceramic electronic component.

2. The ceramic electronic component according to claim 1, wherein the Zn molar content is 33 mol % or less in terms of ZnO.

3. The ceramic electronic component according to claim 1, wherein the Zn molar content is 6 mol % or more in terms of ZnO.

4. The ceramic electronic component according to claim 1, wherein the magnetic layer is sandwiched between a pair of non-magnetic layers including the first principal surface and the second principal surface such that:
the another first external electrode and the another second external electrode are electrically connected therebetween through the via electrode,
a first another via electrode connects the first external electrode to the coil conductor, and
a second another via electrode connects the second external electrode to the coil conductor.

5. A ceramic electronic component comprising
a coil conductor and a via electrode placed away from the coil conductor, the coil conductor and the via electrode being embedded in a magnetic layer,
the coil conductor and the via electrode being formed from a conductive material containing Cu as a main constituent, and the magnetic layer being formed from a ferrite ceramic composition,
the ferrite ceramic composition containing at least Fe, Mn, Ni, and Zn, a Cu molar content thereof being 0 to 5 mol % in terms of CuO, and when a Fe molar content x mol % in terms of $Fe_2O_3$ and a Mn molar content y mol % in terms of $Mn_2O_3$ are represented by (x, y), the (x, y) falls within a region surrounded by A (25, 1), B (47, 1), C (47, 7.5), D (45, 7.5), E (45, 10), F (35, 10), G (35, 7.5), and H (25,7.5),
wherein a non-magnetic layer is formed on at least one principal surface of the magnetic layer,
further, a cavity section filled with an inert gas is formed in either one of the non-magnetic layer and the magnetic layer, and at least a pair of discharge electrodes is placed to be opposed with a predetermined gap therebetween in the cavity section, and
the discharge electrodes are formed from a conductive material containing Cu as its main constituent.

6. The ceramic electronic component according to claim 5, wherein the pair of discharge electrodes are connected to each other through an auxiliary electrode, and the auxiliary electrode has a conductive material containing Cu as a main constituent, the conductive material dispersed in either one of a non-magnetic material forming the non-magnetic layer and a magnetic material forming the magnetic layer.

7. The ceramic electronic component according to claim 4, wherein the coil conductor, the via electrode, the magnetic layer, and the non-magnetic layers are obtained by co-firing.

8. The ceramic electronic component according to claim 4, wherein the non-magnetic layers contain at least Fe, Mn, and Zn, and contain no Ni, and has a Cu molar content of 0 to 5 mol % in terms of CuO, and when a Fe molar content x mol % in terms of $Fe_2O_3$ and a Mn molar content y mol % in terms of $Mn_2O_3$ are represented by (x, y), the (x, y) falls within the region surrounded by A (25, 1), B (47, 1), C (47, 7.5), D (45, 7.5), E (45, 10), F (35, 10), G (35, 7.5), and H (25, 7.5).

9. The ceramic electronic component according to claim 1, wherein the ceramic electronic component is fired in an atmosphere at lower than or equal to an equilibrium oxygen partial pressure of $Cu$—$Cu_2O$.

* * * * *